(12) United States Patent
Kohara et al.

(10) Patent No.: US 7,483,467 B2
(45) Date of Patent: Jan. 27, 2009

(54) SEMICONDUCTOR LASER UNIT AND METHOD FOR MANUFACTURING OPTICAL REFLECTION FILM

(75) Inventors: Naoki Kohara, Okasa (JP); Hironari Takehara, Kyoto (JP); Takaki Iwai, Osaka (JP); Hisatada Yasukawa, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/518,173

(22) Filed: Sep. 11, 2006

(65) Prior Publication Data

US 2007/0071049 A1 Mar. 29, 2007

(30) Foreign Application Priority Data

Sep. 13, 2005 (JP) .............................. 2005-264689

(51) Int. Cl.
*H01S 5/00* (2006.01)
(52) U.S. Cl. ................................. 372/50.12; 372/43.01
(58) Field of Classification Search ............. 372/43.01, 372/50.12
See application file for complete search history.

(56) References Cited

U.S. PATENT DOCUMENTS 6,049,641 A * 4/2000 Deacon et al. ................ 385/15
6,259,713 B1 * 7/2001 Hwu et al. ..................... 372/36
6,261,859 B1 * 7/2001 Ouchi .......................... 438/39
7,033,679 B2 * 4/2006 Okura et al. ................ 428/687

FOREIGN PATENT DOCUMENTS

| JP | 01-027288 A | 1/1989 |
| JP | 09-326535 A | 12/1997 |
| JP | 2000-294831 A | 10/2000 |
| JP | 2001-141916 A | 5/2001 |

* cited by examiner

*Primary Examiner*—Minsun Harvey
*Assistant Examiner*—Patrick Stafford
(74) *Attorney, Agent, or Firm*—McDermott Will & Emery LLP

(57) ABSTRACT

The semiconductor laser unit comprises a laser emission part having a plurality of semiconductor laser elements of different laser beam wavelengths, and a mirror part having an optical reflection film for reflecting laser beams emitted from the laser emission part. The mirror part is blocked out into a plurality of areas to which each laser beam emitted from each of the plurality of semiconductor laser elements enters, and at the same time the reflection film having high reflectance for the laser beams that enter selectively on the areas is provided in each of the plurality of areas.

9 Claims, 6 Drawing Sheets

F I G. 1
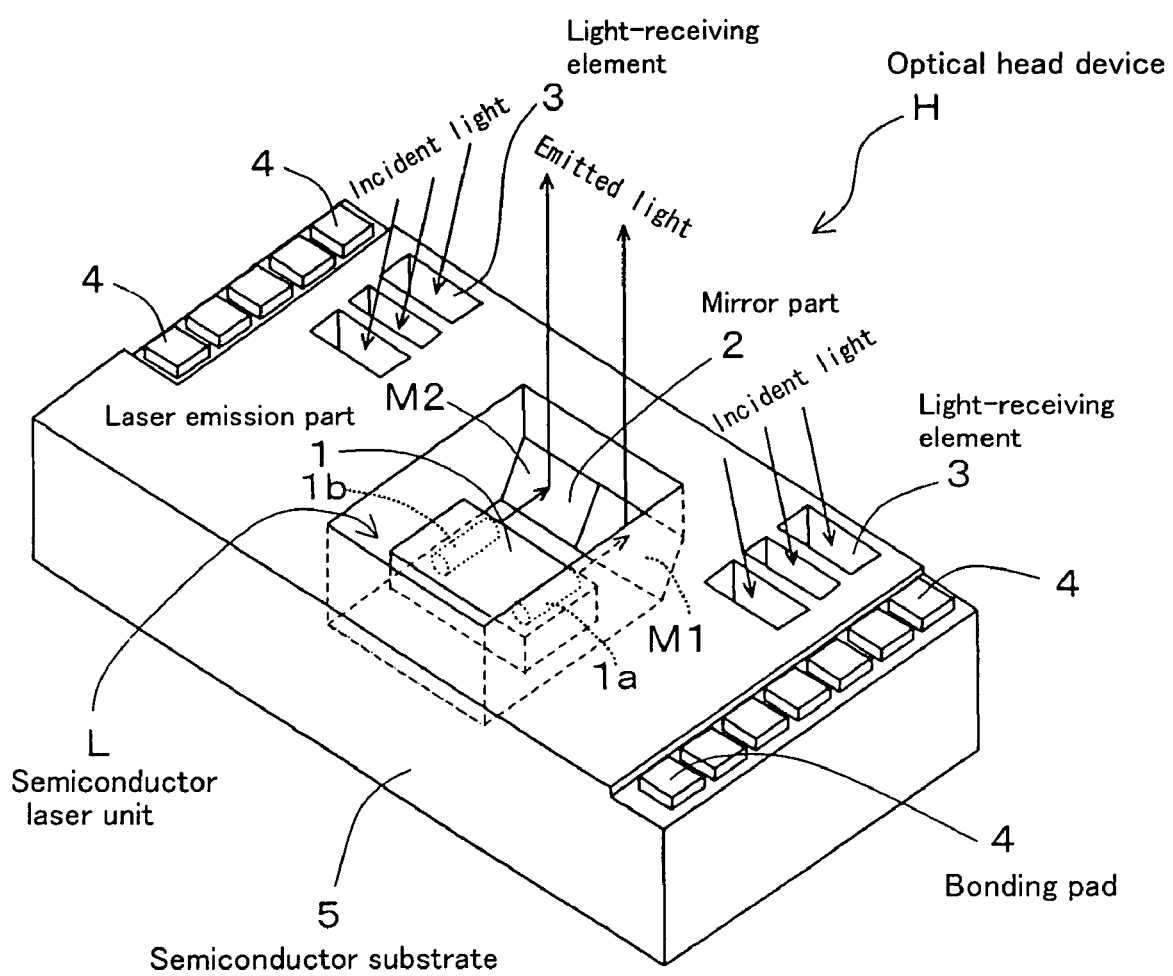

SEMICONDUCTOR LASER UNIT AND METHOD FOR MANUFACTURING OPTICAL REFLECTION FILM

BACKGROUND OF THE INVENTION

1. Field of the Invention

The present invention relates to a semiconductor laser unit used in an optical head device or the like and to a method for manufacturing an optical reflection film.

2. Description of the Related Art

For example, an optical head device is constituted with a semiconductor laser unit for emitting laser beams to a target optical disk, a light-receiving element for receiving the laser beams returned by being reflected at the optical disk, a signal processing circuit and the like for processing electric signals that are generated at the light-receiving element according to the received laser beams. The semiconductor laser unit outputs the laser beams to the outside of the device by reflecting it with a mirror part.

Recently, in order to reduce the size of the device and to simplify alignment control of each optical element, a type in which the semiconductor laser unit, the light-receiving element, and the signal processing circuit are loaded on a single semiconductor substrate has been developed, as disclosed in Japanese Published Patent Literature 1 (Japanese Unexamined Patent Publication 64-27288: pp. 2-3, FIG. 1), for example.

On the occasion of forming the semiconductor laser unit and the light-receiving element on the same substrate as mentioned above, highly positioning accuracy is required at the time of forming the semiconductor laser unit. That is, unless the relative positions of the semiconductor laser unit and the optical disk as a target of irradiating the laser beams are aligned with high precision, there causes a problem in functions of the device.

In order to secure the mounting accuracy of the semiconductor laser unit, as disclosed in Japanese Published Patent Literature 2 (Japanese Unexamined Patent Publication 9-326535: p. 6, FIG. 1), a technique in which grooves are formed on the substrate in advance has been developed so that the bump electrodes of the semiconductor laser element as the emission source of the laser beams can be fitted into the grooves.

In the techniques disclosed in Japanese Published Patent Literatures 1 and 2, the semiconductor laser beams are assumed to be red-infrared rays with the wavelengths of 600 nm-1200 nm, and an Au film is used therein as the optical reflection film. Thus, the reflectivity of the blue rays becomes low in the optical reflection film formed in this manner, and thereby the use efficiency of the light is decreased. Further, when a semiconductor laser emitting blue rays is used, the reflectivity at the Au film becomes deteriorated compared to the case of the red-infrared rays due to the material property. Thus, the intensity of the emitted laser beams becomes attenuated. As a measure for securing the sufficient property for the blue rays, the optical reflection film may be formed as a multilayer film of an Al layer and a dielectric layer. However, in that case, the reflectance of the red-infrared rays becomes lower compared to the one of the Au film, thereby deteriorating the use efficiency of the light. Like this, when the laser beams of blue-infrared rays are emitted simultaneously, the reflectance of either light becomes deteriorated. Structure of the reflection film that corresponds to the wavelength range of the blue-infrared rays and process for achieving it have not yet been proposed so far.

The present invention has been invented to solve such problems, and the object of the present invention therefore is to provide a semiconductor laser unit whose reflectance is excellent for the laser emission light over a wide wavelength area of the blue-infrared rays.

SUMMARY OF THE INVENTION

A semiconductor laser unit of the present invention comprises: a laser emission part having a plurality of semiconductor laser elements of different laser beam wavelengths; and a mirror part having an optical reflection film for reflecting laser beams emitted from the laser emission part, wherein the mirror part is blocked out into a plurality of areas to which each laser beam emitted from each of the plurality of semiconductor laser elements enters and, in each of the plurality of areas, there is provided the reflection film having high reflectance for the laser beams that enters selectively to the areas.

According to this, it is possible to emit the laser beams highly efficiently over a wide wavelength area.

It is desirable for the laser emission part and the mirror part to be formed on a same substrate. This achieves reduction of the size and reservation of the high positioning accuracy with respect to other optical systems.

It is desirable that semiconductor laser element comprise a first semiconductor laser element for emitting a first laser beam having a blue wave range, and a second semiconductor laser element for emitting a second laser beam having a wave range of red-infrared rays; and a first reflection film exhibiting high reflectance for light of blue wave range is provided in an area of the optical reflection film where the first laser beam enters, and a second reflection film exhibiting high reflectance for light of red-infrared wave range is provided in an area of the optical reflection film where the second laser beam enters. In that case, it is more desirable that the blue wave range reflected by the first reflection film be 350 nm-600 nm, and the red-infrared wave range reflected by the second reflection film be 600 nm-1200 nm. By doing so, it becomes possible to emit laser beams rays in a wide wavelength area over the blue-infrared.

It is desirable that the Al layer faces towards the second reflection film in the first reflection film, and a barrier metal layer is provided between the Al layer and the second reflection film. In this case, it is more desirable that the barrier metal layer consists of at least the one selected from Ti, TiW, and TiN as the main material.

According to this, by the presence of the barrier metal layer, chemical reaction between Al and Au/Pt can be suppressed, thereby enabling fine separation of the first reflection film and the second reflection film under a stable condition. Thus, the high surface precision is kept so as to enhance the reflection efficiency, so that blue-infrared laser beams can be reflected efficiently.

There is an embodiment that the plurality of semiconductor laser elements is arranged in parallel along a direction parallel to the surface of the substrate. This corresponds to the structure of the laser emission part in which the plurality of semiconductor laser elements is arranged in the lateral direction.

Furthermore, there is an embodiment that the plurality of semiconductor laser elements is arranged in parallel along a direction orthogonal to the surface of the substrate. This corresponds to the structure of the laser emission part in which the plurality of semiconductor laser elements is arranged in the longitudinal direction.

Further, a method for manufacturing an optical reflection film according to the present invention comprises steps of:

a step for forming a metal layer made of Au or Pt on an oblique face formed on a semiconductor substrate;

a step for forming a barrier metal layer on the metal layer;

a step for forming a first reflection film constituted with a multilayer film of an Al layer and a dielectric layer with the dielectric layer as upper layer, on the barrier metal layer;

a step for forming an opening being a second reflection film area to the dielectric layer; and a step for eliminating the Al layer and the barrier metal layer using the dielectric layer as a hard mask to expose the metal layer lying thereunder as a second reflection film that has a reflection wavelength different from that of the first reflection film.

By use of the dielectric layer as the hard mask, it is possible to avoid such an problem of having difficulty in forming the Al pattern because of resist exfoliation caused by etching Al when the resist is used as the mask. Therefore, it is possible to form with high precision the first reflection film constituted with the multilayer film of the Al layer having the high reflectance for the blue wavelength and the dielectric layer, and the second reflection film made of the metal film of Au or Pt having high reflectance for the red-infrared wavelength. As a result, it is possible to provide the optical reflection film excellent in the reflection efficiency for the laser emitting light in a wide wavelength area of blue-infrared rays.

In the step of forming the opening in the dielectric layer, it is desirable to form the opening by etching with a resist. Further, it is desirable to form the barrier metal layer using at least one selected from Ti, TiW, and TiN as the main material.

According to the method for manufacturing the optical reflection film described above, it is possible to manufacture with high precision the optical reflection film that is excellent in the reflection efficiency for the laser emitted light in a wide wavelength area of blue-infrared rays.

According to the use of the semiconductor laser unit according to the present invention, it is possible to emit the laser beams highly efficiently over a wide wavelength area, while reducing the size of the semiconductor laser unit and increasing the accuracy of the relative positioning with respect to other optical systems.

Furthermore, the method for manufacturing the optical reflection film according to the present invention can provide the optical reflection film comprising the first reflection film for the blue wavelength and the second reflection film for the red-infrared wavelength, which is excellent in the reflection efficiency for the laser emitted light in a wide wavelength area of blue-infrared rays.

The technique of the present invention is effective not only for the semiconductor laser unit used in the optical head device, but also for a semiconductor laser unit in general which is constituted with a combination of the laser emission part and the mirror part.

BRIEF DESCRIPTION OF THE DRAWINGS

Other objects of the present invention will become clear from the following description of the preferred embodiments and the appended claims. Those skilled in the art will appreciate that there are many other advantages not recited in the present invention by embodying the present invention.

FIG. 1 is a perspective view for showing an optical head device on which a semiconductor laser unit is loaded according to a first embodiment of the present invention;

DETAILED DESCRIPTION OF THE INVENTION

Figure 2A:
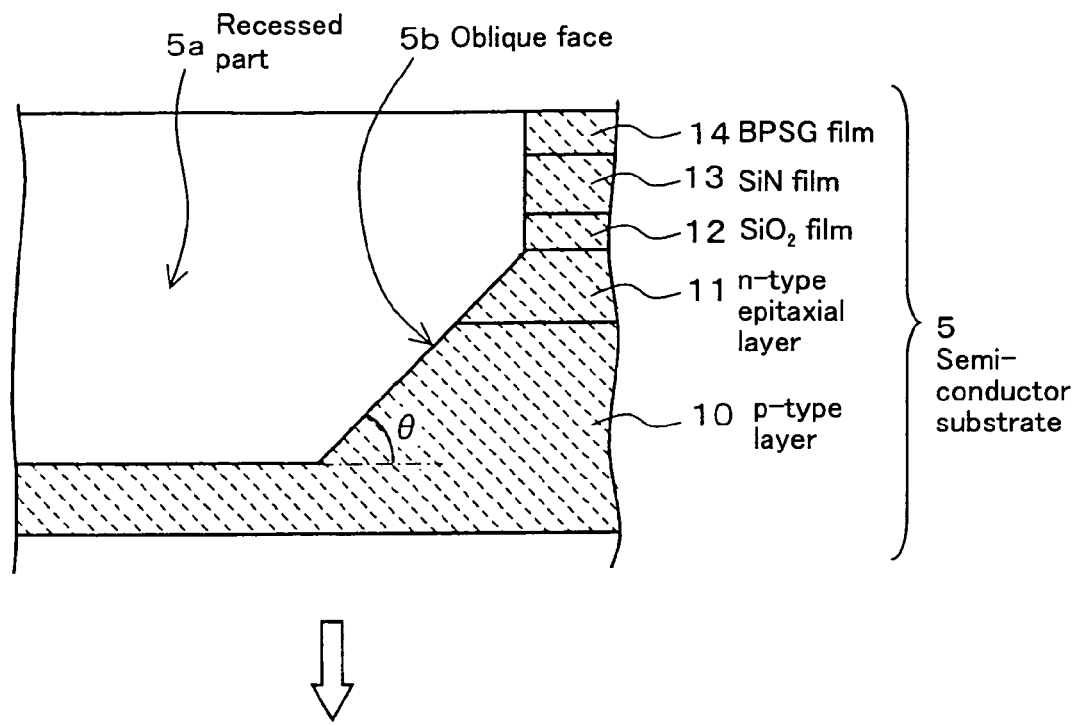
FIG. 2A is a cross sectional view for showing a step (1) of a method for manufacturing an optical reflection film according to the first embodiment of the present invention.

Hereinafter, the followings, embodiments of a semiconductor laser unit according to the present invention will be described in detail referring to the accompanying drawings.

First Embodiment

FIG. 1 is a perspective view for showing an optical head device on which a semiconductor laser unit is loaded according to a first embodiment of the present invention. The semiconductor laser unit L of this embodiment loaded on the optical head device H comprises a laser emission part 1 for emitting laser beams to an optical disk (not shown), and a mirror part 2 having an optical reflection film for reflecting the laser beam from the laser emission part 1. The optical head device H further comprises a light-receiving element 3 for receiving laser beam returned by being reflected at the optical disk, and a plurality of bonding pads 4 arranged on a main surface peripheral area of the optical head device H for being connected to an external circuit. Although not shown, the optical head device H comprises a shield part and a signal processing circuit inside thereof. The laser emission part 1, the mirror part 2, the light-receiving element 3 and the bonding pads 4 are formed on the same semiconductor substrate (Si substrate) 5.

The optical head device H is almost in a cuboid shape as a whole, and plurality of recessed parts are formed on one of the main surfaces. Among those recessed parts, the laser emission part 1 is mounted at the bottom face of the largest recessed part provided in the center area. The mirror part 2 is provided in the recessed part where the laser emission part 1 is mounted. The semiconductor laser unit L consists of the laser emission part 1 and the mirror part 2. The mirror part 2 is provided at the sidewall face on the bottom side in the depth direction of the recessed part. The mirror part 2 has an inclination angle of 45° with respect to the flat bottom face of the recessed part (in parallel to the surface of the device). The angle of inclination is tilted towards the opening side of the recessed part (towards the laser emitting direction of the laser emission part 1).

The mirror part 2 comprises a first reflection film M1 and a second reflection film M2. The first reflection film M1 and the second reflection film M2 are arranged in parallel on the left and right sides in the recessed part. Specifically, two semiconductor laser elements, i.e. a blue-type semiconductor laser 1a and a red-type semiconductor laser element 1b, are arranged in parallel separately on the left and right sides. Accordingly, the reflection area of the mirror part 2 is divided into two on the right and left sides in a direction parallel to the face (bottom face of the recessed part) of the substrate 5, i.e. in the horizontal direction. The first reflection film M1 and the second reflection film M2 are placed on each of those divided areas.

The first reflection film M1 is made of a multilayer film constituted with an Al layer that has high reflectance for the blue wavelength and a dielectric layer. The first reflection film is disposed so as to oppose the blue-type semiconductor laser element 1a. The second reflection film M2 is formed with a metal film of Au or Pt that has high reflectance for red-infrared wavelengths. The second reflection film M2 is disposed so as to oppose the red-type semiconductor laser element 1b.

The laser beam emitted from the laser emission part 1 in the direction parallel to the surface of the substrate 5 is reflected by the mirror part 2 with the inclination angle of 45° to be emitted towards the upper direction (toward the opening of the recessed part). Describing in detail, the emitted laser beam from the blue-type semiconductor laser element 1a is reflected by the first reflection film M1, while the emitted laser beam from the red-type semiconductor laser element 1b is reflected by the second reflection film M2. These laser beams can be emitted simultaneously.

Further, in the peripheral areas on both sides of the optical head device H, light-receiving elements 3 are disposed at a total of six places with a little distance therebetween. Light-receiving elements 3 are arranged at each of three positions on both left and right sides centrally with respect to the laser emission part 1. The light-receiving elements 3 receive the returned laser beams that are reflected by the optical disk. The signal processing circuit provided on the inside generates various signals such as a focus error signal, a tracking error signal, etc. based on the light quantity difference or the like of the received laser beams.

The surface of the optical head device H (except for the bonding pads 4) is covered with the Au layer that constitutes the second reflection film M2 and the Ti layer provided thereunder, so that the inside of the device is not affected by the laser beams. This also acts as protection of the device from corrosion.

As the optical had device H comprises the laser emission part 1, the mirror part 2, and the light-receiving elements 3 mounted on the same substrate 5, the device can be reduced in size. According to this, the length between the laser emission part 1 and the light-receiving element 3 can be made shorter, so that it is possible to design the optical path of the laser beams in an efficient manner. Further, it becomes possible to simplify the alignment control of each optical element provided between the semiconductor laser unit L and the optical disk.

The most characteristic part of this embodiment is the mirror part 2, and the structure thereof will be described in detail hereinafter.

The reflectance of the first reflection film M1 formed with the multilayer film of the Al layer and the dielectric layer is 90% for the blue rays and 90% for the red-infrared rays as well. Further, the reflectance of the second reflection film M2 constituted with the Au film is 40% for the blue rays and 95-98% for the red-infrared rays. It is possible in the semiconductor laser unit L of this embodiment comprising the first reflection film M1 and the second reflection film M2 to reflect the laser emitted light in a wide wavelength area of the blue-infrared rays (capable of achieving high reflectance).

Next, description will be given to a method for manufacturing the optical reflection film in the semiconductor laser unit of the above-described structure referring to the cross sectional views of the steps shown in FIG. 2A-FIG. 4B.

First, as shown in FIG. 2A, the semiconductor substrate 5 is prepared. The semiconductor substrate 5 comprises structure that an n-type epitaxial layer 11, an $SiO_2$ film 12, an SiN film 13, and a BPSG film 14 are laminated on a silicon p-type layer 10 in this order. BPSG is:a glass obtained by adding boron (B) and phosphorus (P) to a silicon oxide film. Etching with BHF (buffered hydrofluoric acid) is applied to the semiconductor substrate 5 for exposing the $SiO_2$ film 12. Further, an opening is formed on a part of the $SiO_2$ film 12 so as to form a recessed part 5a. The recessed part 5a is formed in a rectangular shape with a flat bottom face (in parallel to the surface of the device). Furthermore, Si anisotropic etching is applied to the semiconductor substrate 5 with the $SiO_2$ film 12 as the mask so as to form an oblique face 5b in a part of the sidewall face of the recessed part 5a. The oblique face 5b has an inclination angle θ of 45° with respect to the bottom face of the recessed part. The mirror part 2 is formed on this oblique face 5b in a post-process.

A (100) plane direction substrate with 9.7° off-angle is used for the p-type layer 10. The (111) plane in this case is processed as the sidewall (the oblique face 5b) having the inclination angle of 45° with respect to the surface of the substrate. Further, 20 wt % of KOH solution is used for Si anisotropic etching, and the etching depth for the p-type layer 10 is defined to be about 40 μm.

Figure 2B:
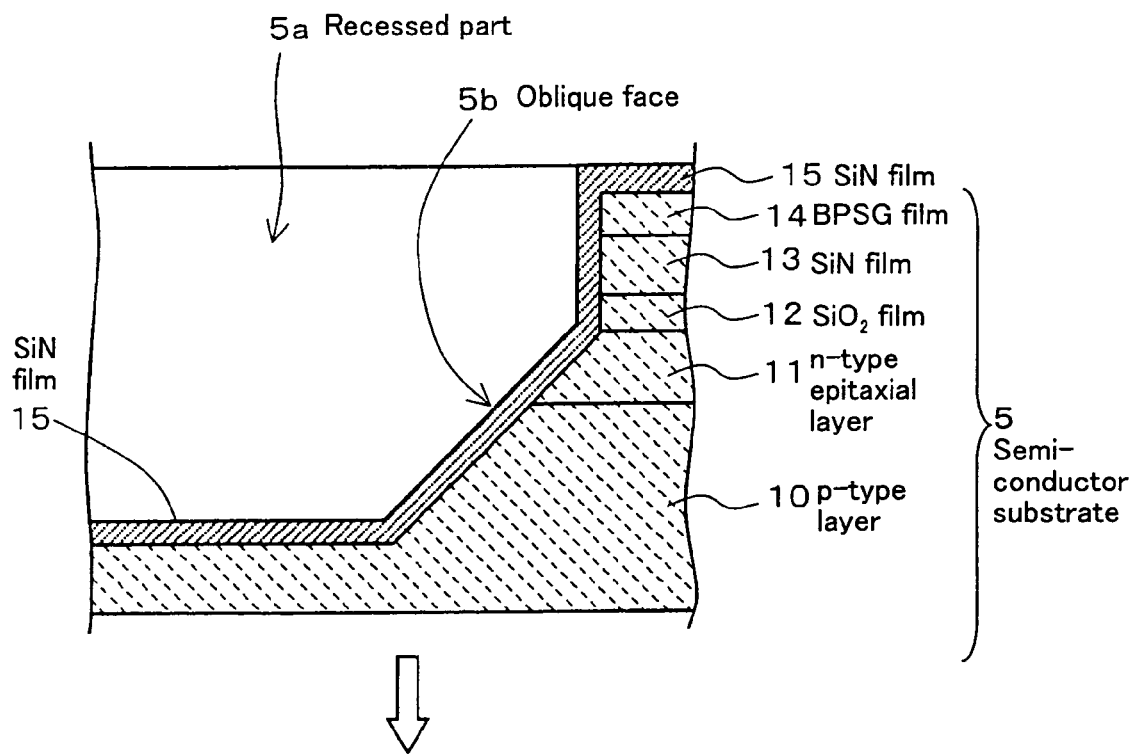
FIG. 2B is a cross sectional view for showing a step (2) of the method for manufacturing an optical reflection film according to the first embodiment of the present invention.
Figure 3A:
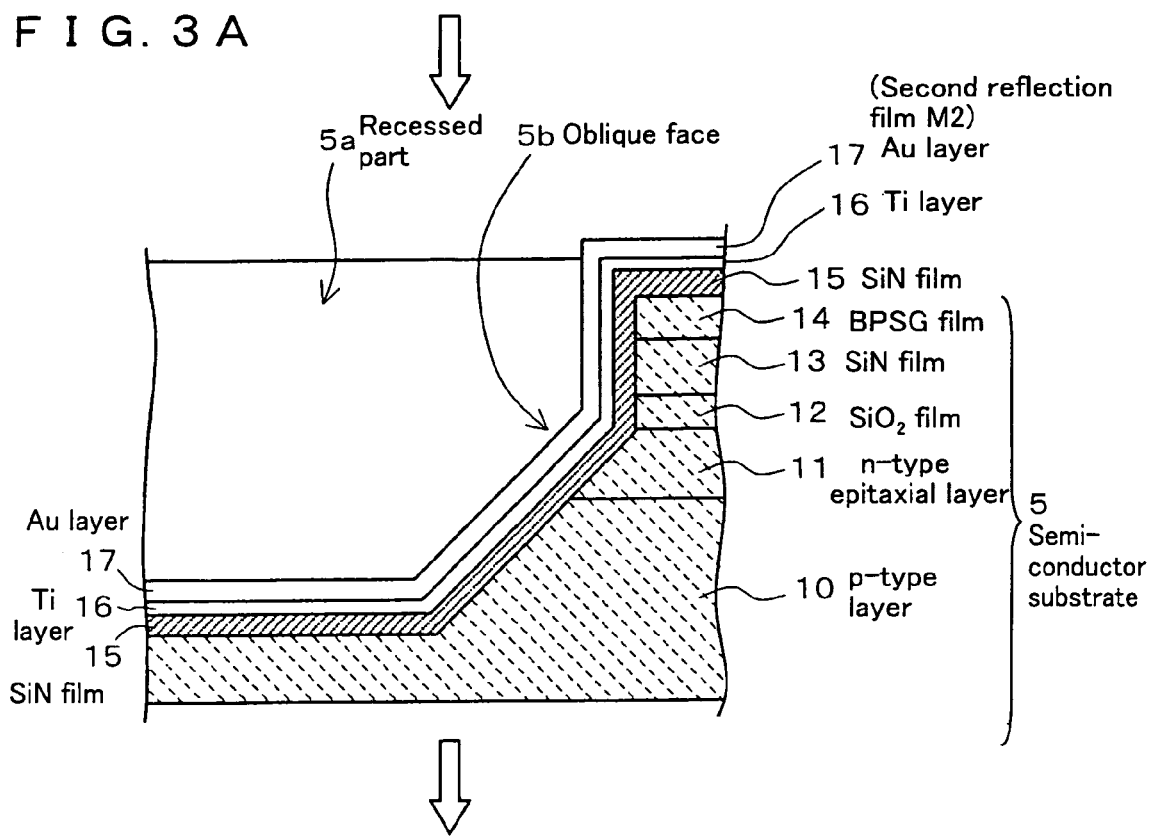
FIG. 3A is a cross sectional view for showing a step (3) of the method for manufacturing an optical reflection film according to the first embodiment of the present invention.

Then, as shown in FIG. 2B, an SiN film 15 is formed over the entire surface of the substrate 5 including the inner wall face of the recessed part 5a by vapor deposition. Subsequently, as shown in FIG. 3A, a Ti layer 16 and an Au layer 17 are laminated over the SiN film 15 in turn by sputtering. The Au layer 17 constitutes the second reflection film M2.

The Ti layer 16 and the Au layer 17 are formed in a state of covering almost the entire surface of the optical head device H to serve as a shielding part. The thickness of the Ti layer 16 is 0.2 μm, and that of the Au layer 17 is 0.4 μm.

Figure 3B:
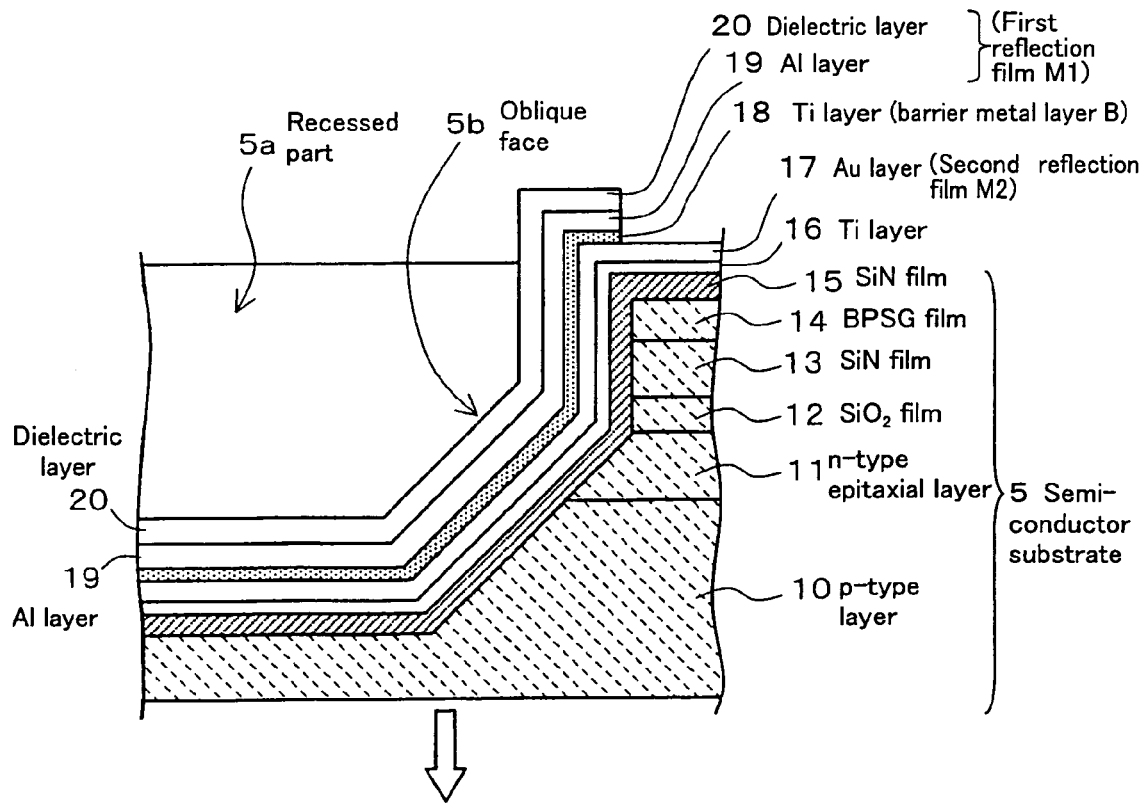
FIG. 3B is a cross sectional view for showing a step (4) of the method for manufacturing an optical reflection film according to the first embodiment of the present invention.

Then, as shown in FIG. 3B, a Ti layer 18 as a barrier metal layer B is formed on the Au layer 17 that becomes the second reflection film M2. Further, a multilayer film constituted with the Al layer 19 and the dielectric layer 20 is formed on the Ti layer 18 by sputtering. The Al layer 19 constitutes the first reflection film M1. As the dielectric layer 20, it is preferable to use a material having the refractive index n of about 1.3-1.5. Examples of such material may be $SiO_x$ (x≦2), $MgF_2$, etc. It is preferable to use $SiO_x$ in terms of processability and stability.

Figure 4A:
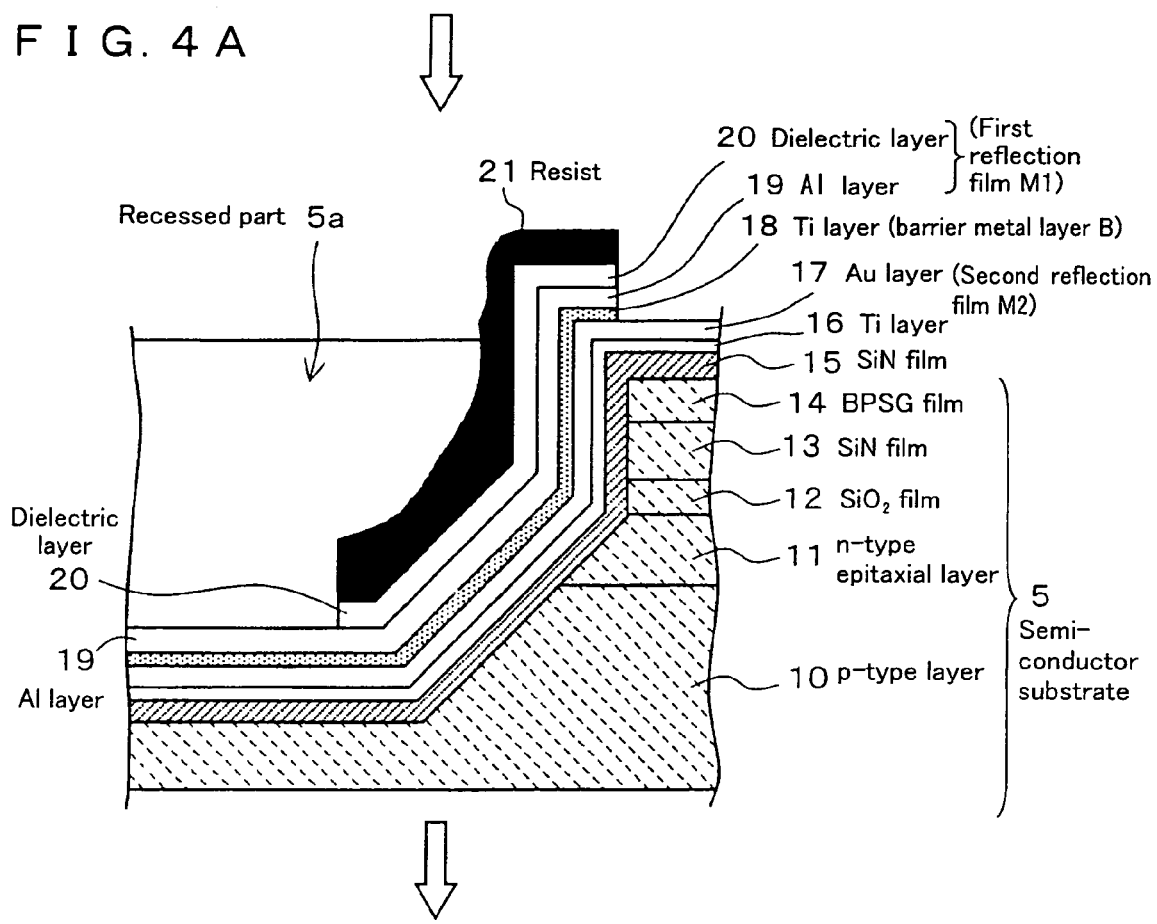
FIG. 4A is a cross sectional view for showing a step (5) of the method for manufacturing an optical reflection film according to the first embodiment of the present invention.
Figure 4B:
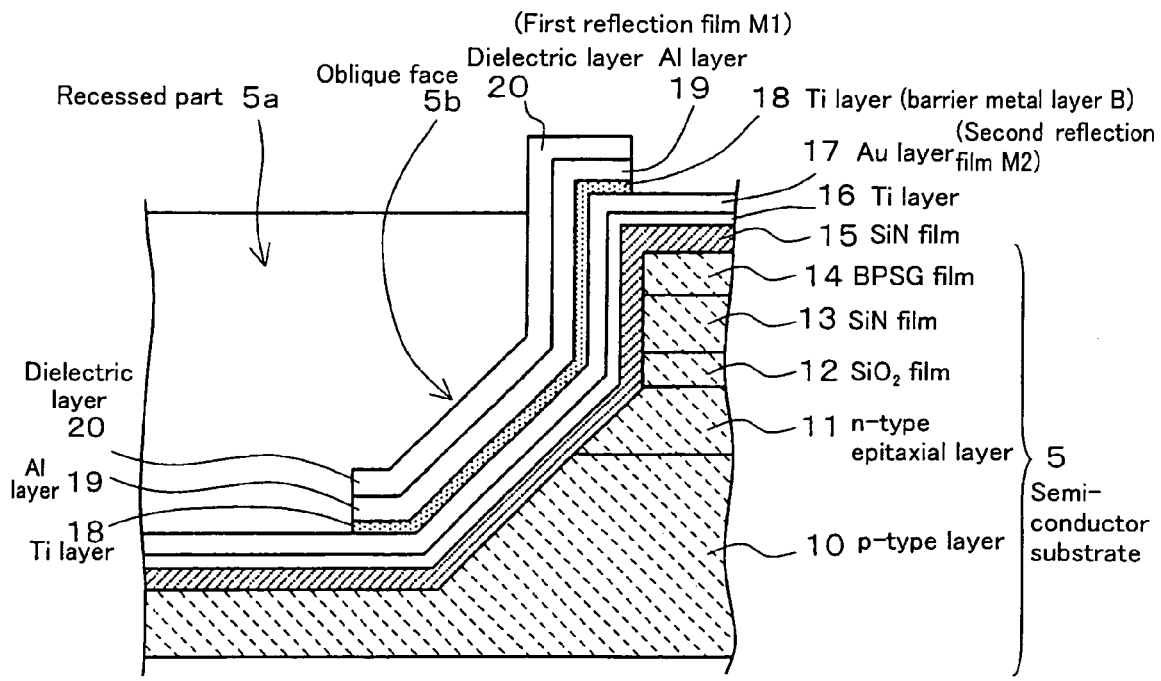
FIG. 4B is a cross sectional view for showing a step (6) of the method for manufacturing an optical reflection film according to the first embodiment of the present invention.

Subsequently, as shown in FIG. 4A, patterning of the dielectric layer 20 is performed by photolithography using a resist 21 as the mask, and patterning of the Al layer and the Ti layer 18 is performed by wet-etching using the patterned dielectric layer 20 as the hard mask.

As a result of the above-described processing, the Au layer 17 (the second reflection film M2) and the multilayer film (the first reflection film M1) constituted with the Al layer 19 and the dielectric layer 20 are formed simultaneously on the mirror part 2. The barrier metal layer B (Ti layer 18) is interposed between the Au layer 17 and the Al layer 19. According to this, inhibition of patterning Al due to the reaction between Au and Al can be prevented. The barrier metal layer B is not limited to Ti. Other material such as TiW or TiN may be used, as long as it is capable of preventing the reaction between Au and Al.

The use of the dielectric layer 20 as the mask for etching the Al layer 19 has a following advantage. In the conventional method, the resist has been used as the mask. By this, however, exfoliation of the resist is generated and the patterning of the Al layer becomes difficult. Such problem of resist exfoliation can be solved by etching the Al layer 19 using the dielectric layer 20 as the mask as in this embodiment.

Thus, in the manufacturing method according to the present invention, the first reflection film M1 constituted with the multiplayer film of the Al layer (the optical reflection film for the blue wavelength) and the dielectric layer, and the second reflection film M2 constituted with the Au film (the optical reflection film for the red or infrared wavelength), are formed to perform patterning by using the technique of photolithography, and thereby it becomes possible to form the first reflection film M1 and the second reflection film M2 in arbitrary shapes on the same oblique face with high precision.

According to this, a semiconductor laser unit having the following characteristics can be provided.

having excellent reflectance for the laser emitted light in a wide wavelength area of blue-infrared rays
having a small dimension and high positioning accuracy
capable of emitting the laser beams with high laser intensity Further, the Ti layer 16 and the Au layer 17 covering almost the entire surface of the optical head device H can be formed in the same step, so that it is advantageous in terms of the manufacturing cost.

The second reflection film M2 is not limited to the Au layer 17 but may be formed with a Pt layer or the like. Furthermore, a method other than sputtering, such as vacuum evaporation, may be used for forming the Ti layer 16 and the Au layer 17.

Figure 5A:
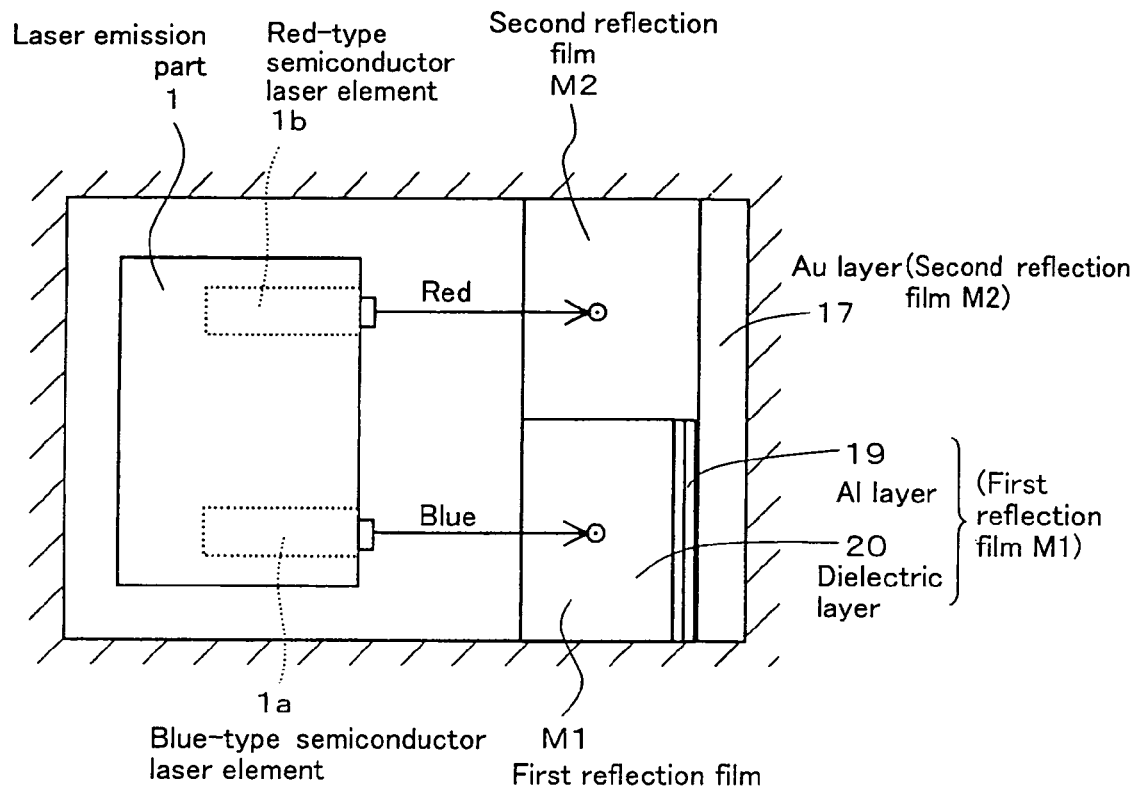
FIG. 5A is a plan view for showing the aspect of a laser emission part and a mirror part according to the first embodiment of the present invention.
Figure 5B:
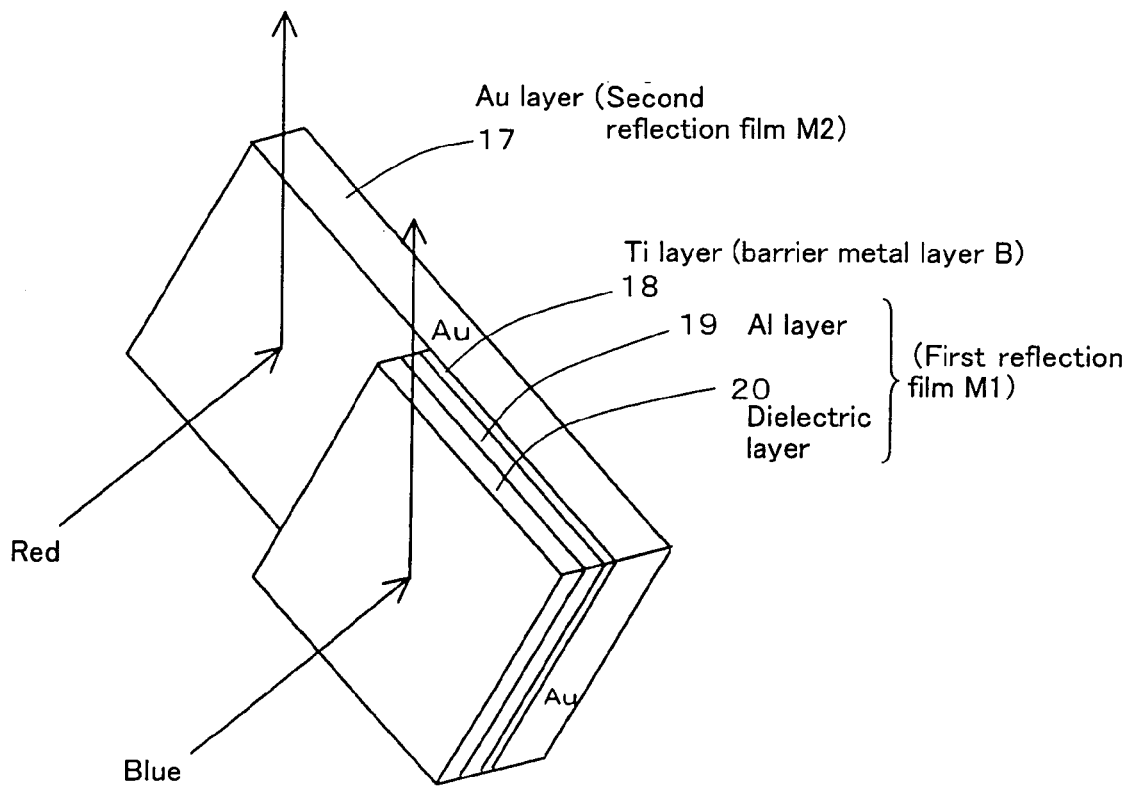
FIG. 5B is a perspective view for showing the aspect of the laser emission part and the mirror part according to the first embodiment of the present invention.

FIG. 5A is a plan view for showing the state of the laser emission part 1 and the mirror part 2, and FIG. 5B is a perspective view of the mirror part 2.

On the occasion of forming the mirror part 2 on the oblique face 5b in the manner described above, the oblique face 5b is divided into two in the horizontal direction as shown in FIG. 5B. The first reflection film M1, which is constituted with the multilayer film of the Al layer that exhibits the high reflectance for the blue wavelength and the dielectric layer, is made to be exposed in one area, and the second reflection film M2 constituted with the Au film that exhibits the high reflectance for the red-infrared wavelength is made to be in the other area. On the occasion of adjusting division of the areas, the pattern of the resist 21 is devised. The step between the surface of the first reflection film Ml and the surface of the second reflection film M2 is sufficiently small. For the laser emission part 1, the blue-type semiconductor laser 1a and the red-type semiconductor laser 1b are disposed on the right and left sides.

Second Embodiment

Figure 6A:
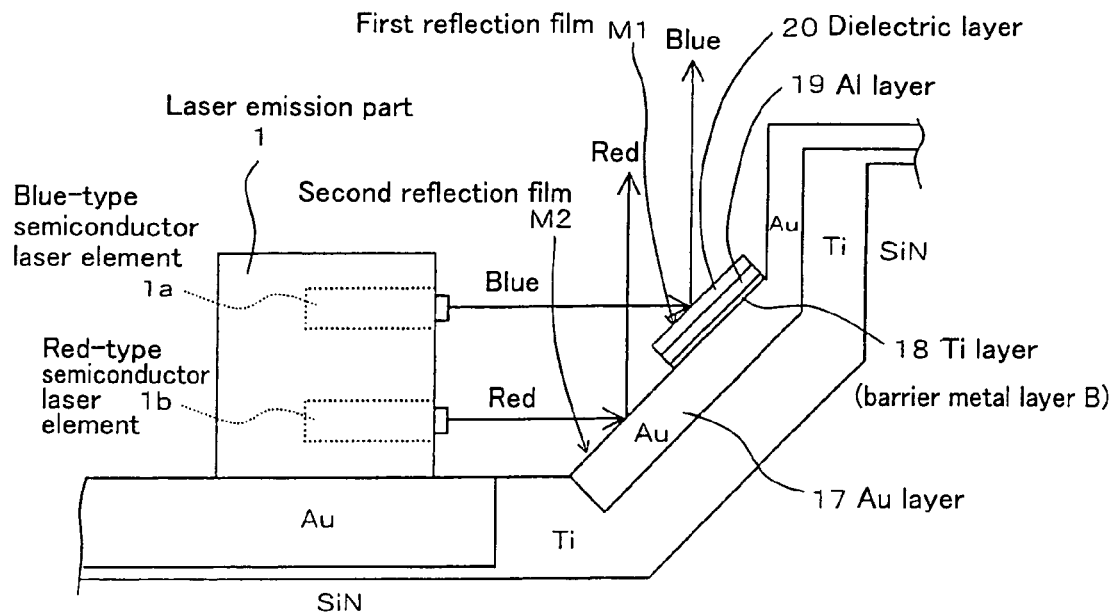
FIG. 6A is a plan view for showing the aspect of a laser emission part and a mirror part according to a second embodiment of the present invention.
Figure 6B:
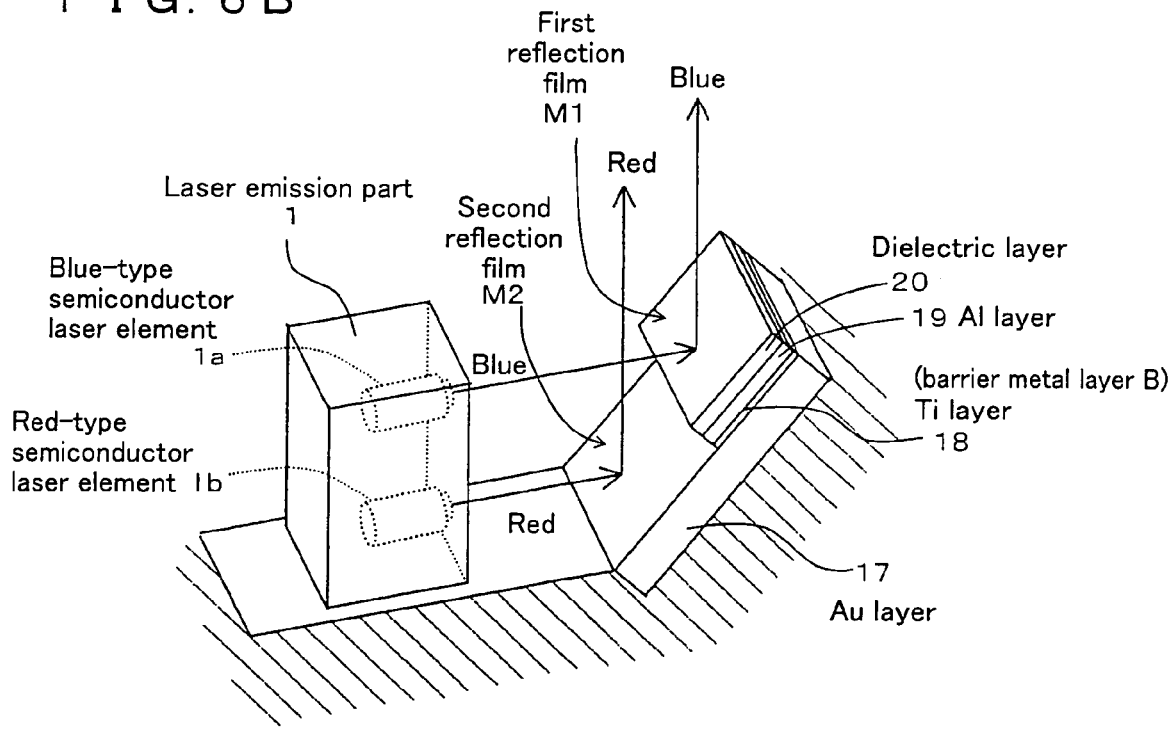
FIG. 6B is a perspective view for showing the aspect of the laser emission part and the mirror part according to the second embodiment of the present invention.

The semiconductor laser unit according to a second embodiment of the present invention will be described referring to FIG. 6. FIG. 6A is a side view for showing the aspect of the laser emission part 1 and the mirror part 2, and FIG. 6B is a perspective view thereof.

The oblique face 5b in mirror part 2 is divided into two in the inclination direction (vertical direction). Then, the first reflection film M1, which is constituted with the multilayer film of the Al layer that exhibits the high reflectance for the blue wavelength and the dielectric layer, is made to be exposed in the upper area, and the second reflection film M2 constituted with the Au film that exhibits the high reflectance for the red-infrared wavelength is made to be exposed in the lower area. The step between the surface of the first reflection film M1 and the surface of the second reflection film M2 is sufficiently small.

For the laser emission part 1, the blue-type semiconductor laser 1a and the red-type semiconductor laser 1b are disposed above and below. The blue-type semiconductor laser 1a is disposed on the upper side, and the red-type semiconductor laser 1b is disposed on the lower side.

According to each of the embodiments of the present invention, it is possible in the mirror part 2 to form the first reflection film M1, which is constituted with the multilayer film of the Al layer that exhibits the high reflectance for the blue wavelength and the dielectric layer, and the second reflection film M2 constituted with the Au film that exhibits the high reflectance for the red-infrared wavelength, on the same oblique face 5b with high precision. The mirror part 2 constituted in this manner has the excellent reflectance for the laser emitted light in a wide wavelength area of the blue-infrared rays, and is capable of emitting the laser beams with high intensity.

Furthermore, since the first reflection film M1 and the second reflection film M2 are formed integrally on a common oblique face in the mirror part 2, and additionally the laser emission part 1 and the mirror part 2 are formed on the same substrate 5, the size of the semiconductor laser unit L can be reduced and the relative positioning accuracy with respect to other optical systems can be increased.

(Others)

In the above, a description has been given referring to the case of mounting the semiconductor laser unit on the optical head device. However, the present invention is not limited to that but may be in any other forms, as long as it is in a combination of the laser emission part and the mirror part.

Further, for the first reflection film M1 having the high reflectance for the blue wavelength, an Ag layer may be used instead of the Al layer so as to form the film M1 with a multiplayer of the Ag layer and the dielectric layer. Nevertheless, the Al layer is preferable in terms of the stability in the forming steps.

Furthermore, the Au layer 17 and the Ti layer 16 are not limited to be in a single-layer structure but may be in a structure of two layers or more.

Moreover, it is also possible to interpose a heat sink layer or a solder layer between the laser emission part 1 and the Au layer 17 right below. In that case, it is desirable to interpose two or more layers of lamination films of the Au layer 17 and the Ti layer 16 between the heat sink layer and the solder layer.

The number and the form of the light-receiving elements 3 can be determined arbitrarily.

Though the preferred embodiments of this invention are explained in detail, it will be understood that various modifications may be made therein, and it is intended to cover in the appended claims all such modifications as fall within the true spirit and scope of this invention.

What is claimed is:

1. A semiconductor laser unit, comprising:
  a laser emission part including a first semiconductor laser element for emitting a first laser beam having a blue wave range; and a second semiconductor laser element for emitting a second laser beam having a wave range of red-infrared rays, the first and second semiconductor laser element being provided in a same recessed part on a substrate; and a mirror part for reflecting laser beams emitted from said laser emission part, the mirror part being provided on a sidewall face of the recessed part, wherein said mirror part is made up of exposed surfaces of first and second reflection films, the first reflection film being provided for the first laser beam to enter and exhibiting high reflectance for light of blue wave range, and the second reflection film being provided for the second laser beam to enter and exhibiting high reflectance for light of red-infrared wave range; wherein:

said reflectance of said first reflection film is higher than said reflectance of said second reflection film for light of blue wave range, and said reflectance of said second reflection film is higher than said reflectance of said first reflection film for light of red-infrared wave range; and said first reflection film for said first laser beam to enter is provided on a portion of said second reflection film, and a portion of said second reflection film on which said first reflection film is not provided is where said second laser beam enters.

2. The semiconductor laser unit according to claim 1, wherein:

said first reflection film comprises a multilayer film formed by laminating an Al layer that exhibits high reflectance for light of a blue wave range and a dielectric layer; and said second reflection film comprises an Au film or a Pt film that exhibit high reflectance for light of red-infrared wave range.

3. The semiconductor laser unit according to claim 1, wherein, said blue wave range reflected by said first reflection film is 350 nm-600 nm, and said red-infrared wave range reflected by said second reflection film is 600 nm-1200 nm.

4. The semiconductor laser unit according to claim 2, wherein said dielectric layer is made of a material having a value of refractive index n=1.3-1.5.

5. The semiconductor laser unit according to claim 2, wherein said dielectric layer is made of $SiO_x(x \leq 2)$ or $MgF_2$.

6. The semiconductor laser unit according to claim 2, wherein said Al layer faces towards said second reflection film in said first reflection film, and a barrier metal layer is provided between said Al layer and said second reflection film.

7. The semiconductor laser unit according to claim 3, wherein said barrier metal layer consists of at least the one selected from Ti, TiW, and TiN as a main material.

8. The semiconductor laser unit according to claim 1, wherein said plurality of semiconductor laser elements are arranged in parallel along a direction parallel to a surface of said substrate.

9. The semiconductor laser unit according to claim 1, wherein said plurality of semiconductor laser elements are arranged in parallel along a direction orthogonal to a surface of said substrate.

* * * * *